(12) United States Patent
Lee et al.

(10) Patent No.: US 8,860,448 B2
(45) Date of Patent: Oct. 14, 2014

(54) TEST SCHEMES AND APPARATUS FOR PASSIVE INTERPOSERS

(75) Inventors: Yun-Han Lee, Baoshan Township (TW); Mill-Jer Wang, Hsin-Chu (TW); Tan-Li Chou, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 536 days.

(21) Appl. No.: 13/184,008

(22) Filed: Jul. 15, 2011

(65) Prior Publication Data
US 2013/0015872 A1    Jan. 17, 2013

(51) Int. Cl.
 G01R 31/20    (2006.01)
 G01R 1/073    (2006.01)

(52) U.S. Cl.
 CPC ............................. G01R 1/07385 (2013.01)
 USPC ............ 324/754.07; 324/754.27; 324/754.18; 324/756.03

(58) Field of Classification Search
 USPC .................................................. 324/754.07
 See application file for complete search history.

(56) References Cited

U.S. PATENT DOCUMENTS

| | | | |
|---|---|---|---|
| 6,366,112 B1 * | 4/2002 | Doherty et al. .......... 324/754.18 |
| 2005/0024072 A1 * | 2/2005 | Schaeffer et al. .............. 324/754 |
| 2007/0162800 A1 * | 7/2007 | Tanaka ........................... 714/724 |
| 2008/0048685 A1 * | 2/2008 | Chui et al. ..................... 324/754 |
| 2008/0077836 A1 | 3/2008 | Khoche et al. |
| 2008/0175080 A1 * | 7/2008 | Kim et al. ...................... 365/201 |
| 2009/0085596 A1 * | 4/2009 | Ruf et al. ...................... 324/761 |
| 2009/0128171 A1 * | 5/2009 | Okumura et al. ............. 324/754 |
| 2010/0026328 A1 * | 2/2010 | Tanaka ........................... 324/754 |
| 2010/0045330 A1 * | 2/2010 | Sleijpen et al. ................ 324/765 |
| 2010/0079160 A1 * | 4/2010 | Hernandez et al. ........... 324/754 |
| 2010/0301885 A1 * | 12/2010 | Mayder ..................... 324/754.07 |
| 2011/0006797 A1 * | 1/2011 | Hiratsuka ................ 324/756.03 |
| 2011/0043237 A1 * | 2/2011 | Kiyokawa et al. ........ 324/756.03 |
| 2011/0148456 A1 * | 6/2011 | Mooyman-Beck et al. ......................... 324/762.02 |
| 2011/0267085 A1 * | 11/2011 | Berry et al. .............. 324/754.07 |
| 2011/0291682 A1 * | 12/2011 | Kawahara et al. ........ 324/754.07 |
| 2012/0124441 A1 * | 5/2012 | Teng et al. ..................... 714/735 |
| 2012/0139572 A1 * | 6/2012 | Kim .......................... 324/754.07 |
| 2012/0161129 A1 * | 6/2012 | Chen .............................. 257/48 |

OTHER PUBLICATIONS http://www.reidashman.com/interface/5/, "TRIAD Spring Probe Tower," Reid-Ashman Manufacturing, Inc., downloaded Mar. 12, 2012, 1 pg.
http://www.intest.com/products/intddock_teradynecatalyst.htm, "Teradyne Catalyst Tower," inTEST Corporation, downloaded Mar. 12, 2012, 1 pg.
Weeden, O., "Probe Card Tutorial," Keithley Instruments, Inc., pp. 1-40, copyright 2003, Keithley Instruments, Inc.
Gupta, P., et al., "Layout-Aware Scan Chain Synthesis for Improved Path Delay Fault Coverage", IEEE Transactions on Computer-Aided Design of Integrated Circuits and Systems, vol. 24, No. 7, Jul. 2005, pp. 1104-1114.
"IEEE Standard Test Access Port and Boundary-Scan Architecture," IEEE Std 1149.1-1990, Downloaded May 3, 2011, 139 pages, Copyright © 1993, Institute of Electrical and Electronics Engineers, Inc.

* cited by examiner

Primary Examiner — Benjamin M Baldridge
(74) Attorney, Agent, or Firm — Slater & Matsil, L.L.P.

(57) ABSTRACT

A probe card includes a plurality of probe pins, and a switch network connected to the plurality of probe pins. The switch network is configured to connect the plurality of probe pins in a first pattern, and reconnect the plurality of probe pins in a second pattern different from the first pattern.

20 Claims, 14 Drawing Sheets

TEST SCHEMES AND APPARATUS FOR PASSIVE INTERPOSERS

BACKGROUND

In three-dimensional integrated circuits, interposers are used for bonding devices. Interposers are often passive interposers, wherein there are no active devices such as transistors formed in the interposers. Through-Silicon Vias (TSVs) are used to make electrical connections from one side of an interposer to the opposite side. Further, there may be metal routing layers on one side or both sides of an interposer, wherein the metal routing layers are used to electrically connect solder bumps on the surface of the interposer to the TSVs, and to electrically interconnect the solder bumps.

Conventionally, before the interposers are bonded to other package components, the connections in the interposers are often open connections. It is difficult to test the interposers having the open connections efficiently. The conventional boundary scan testing cannot be used if the interposers are to be tested before dies are bonded thereon.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An apparatus for testing the reliability of integrated circuit devices and the methods for performing the testing are provided in accordance with various embodiments. Throughout the various views and illustrative embodiments, like reference numbers are used to designate like elements. Throughout the description, the term "interposer" are used as examples of devices-under-test (DUTs). It is appreciated that other integrated circuit devices such as printed circuit boards (PCBs), package substrates, device dies, and the like, may also be tested using the apparatus and the test methods in accordance with embodiments.

Figure 1:
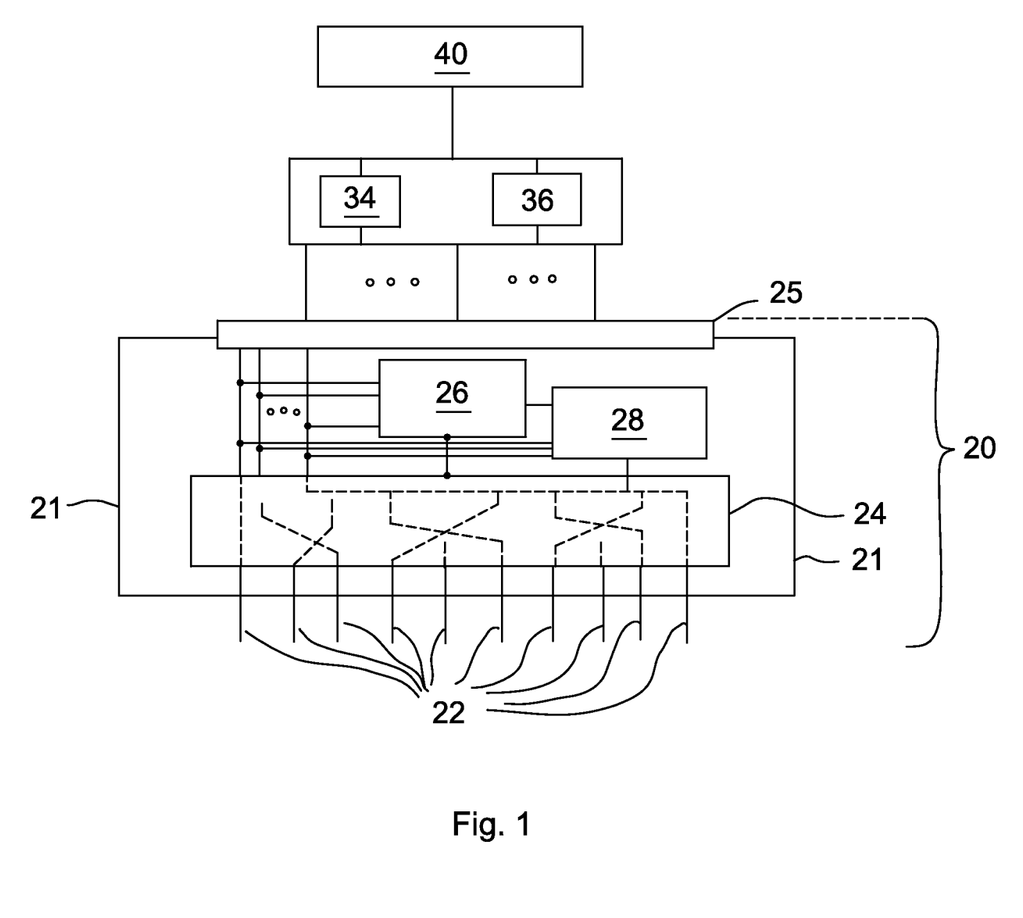
FIG. 1 illustrates a block diagram of a probe card in accordance with an embodiment.

FIG. 1 schematically illustrates a block diagram of a probe card in accordance with embodiments. Probe card 20 includes probe pins 22, which are used to contact the bond pads in a DUT, such as an interposer, which may be a passive interposer with no active devices (such as transistors) therein. Probe card 20 also includes active circuits therein, wherein the active circuits may include switch network 24, programmable storage 26, controller/processor 28, and/or the like. Switch network 24 is built inside probe card 20. In an embodiment, switch network 24 is configured to interconnect inputs/outputs (I/O) 25 to probe pins 22. IOs 25 of probe card 20 are used to input and output signals, which include control signals, test patterns, test results, and/or the like. The control signals may further include the signals that are used to direct switch network 24 to configure and reconfigure its connections. The control signals may also be used to apply different test patterns to the portions of probe pins 22 that are designated as input pins, and to retrieve output patterns from the probe pins 22 that are designated as output pins.

Switch network 24 can configure and reconfigure the connections of probe pins 22, so that some of probe pins 22 are configured as input pins, and some of probe pins 22 are configured as output pins. Each of the probe pins 22 may be programmed as an input pin or an output pin. In different probing of a same DUT or different DUTs, a same probe pin 22 may be configured as an input pin or an output pin. The reconfiguration of switch network 24 is performed electrically, without the need to mechanically rearrange the wires, if any, in probe card 20. In an exemplary embodiment, a first one of the probe pins 22 is connected to one of IOs 25, while after the reconfiguration, a second one of probe pins 22 is connected to the same one of IOs 25.

In an exemplary embodiment, input signals such as driving patterns are received from tester 40 and are routed by switch network 24 to desirable probe pins 22 (input pins), and to the DUT. The output signals from the DUT are routed by switch network 24 to appropriate IOs 25, and then to tester 40. In alternative embodiments, switch network 24 is configured to route the driving patterns stored in programmable storage 26 to desirable probe pins 22 (input pins), and the resulting output signals are retrieved through switch network 24, and compared to the expected patterns stored in programmable storage 26, wherein the comparison may be performed inside probe card by controller/processor 28.

Probe card 20 may include programmable storage 26, which is electrically coupled to switch network 24. Programmable storage 26 may store the driving patterns that will be provided to probe pins 22 as input signals (provided to the DUT), and may store the expected patterns that will be used to compare to the output signals (retrieved from the DUT). The input and output patterns may be in the form of logic high and logic low signals. Alternative, each of the input and output patterns may include a serial of digital signals such as 001100, etc. Accordingly, by providing driving patterns into the designated input pins 22, retrieving output patterns from the designated output pins 22, and comparing the output patterns with the expected patterns stored in programmable storage 26, the connections in the DUT may be determined, and defective connections, such as opens, shorts, bridges, and the like, may be found.

Optionally, probe card 20 may also include controller/processor 28 that is electrically and signally connected to switch network 24 and programmable storage 26. Controller/processor 28 may be used to control the testing of the DUT. One or all of switch network 24, programmable storage 26, and controller/processor 28 may be formed of application specific integrated circuit (ASIC) or field-programmable gate array (FPGA). Controller/processor 28 may be configured to provide different driving patterns to input pins 22, retrieve output patterns from output pins 22, and compare the output patterns with the expected patterns to determine the defective connections. Accordingly, controller/processor 28 may perform some of the functions of conventional testers (test equipments). Probe card 20 in accordance with embodiments, instead of passing test signals and raw output signals between the DUT and testers, may also determine the defective connections, and provide the test result including the information of defective connections to tester 40. Accordingly, tester 40 may have less built-in functions.

In an embodiment, probe card 20 includes casing 21, with probe pins 22 extending from inside casing 21 to outside of casing 21. In an embodiment, switch network 24, programmable storage 26, and controller/processor 28 are located within casing 21. IOs 25 may couple switch network 24, programmable storage 26, and/or controller/processor 28 to outside casing 21 signally and electrically. In alternative embodiments, probe card 20 include switch network 24 therein, while programmable storage 26 and/or controller/processor 28 may be built in other parts of the test apparatus such as toggle switch (tower) 34, load board 36, and tester 40. In the embodiments that programmable storage 26 and controller/processor 28 are not in probe card 20, programmable storage 26 and controller/processor 28 are electrically and signally coupled to switch network 24 through IOs 25.

Figure 2:
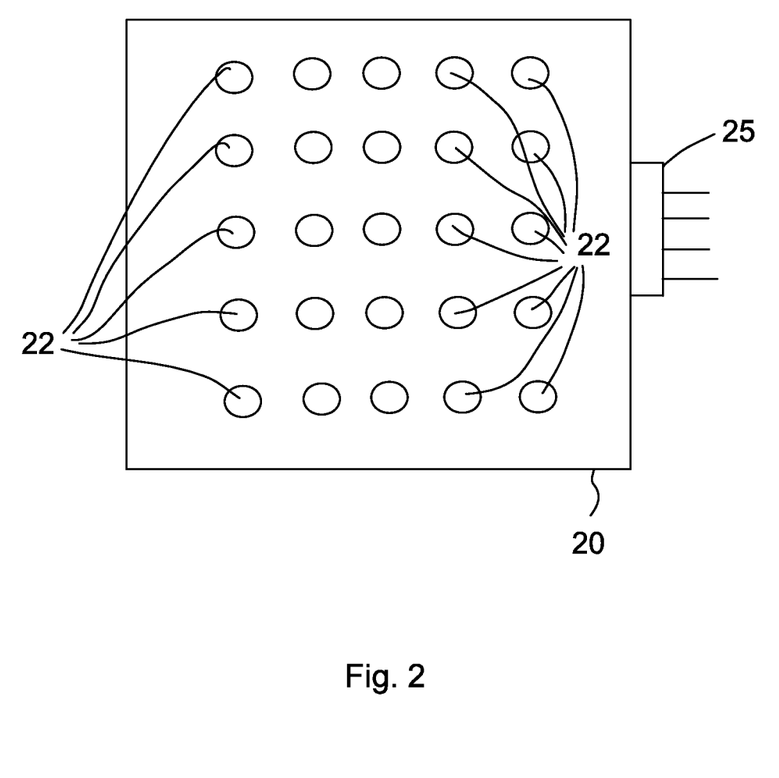
FIG. 2 illustrates a bottom view of a probe card, with probe pins at the bottom of the probe card being illustrated.
Figure 3:
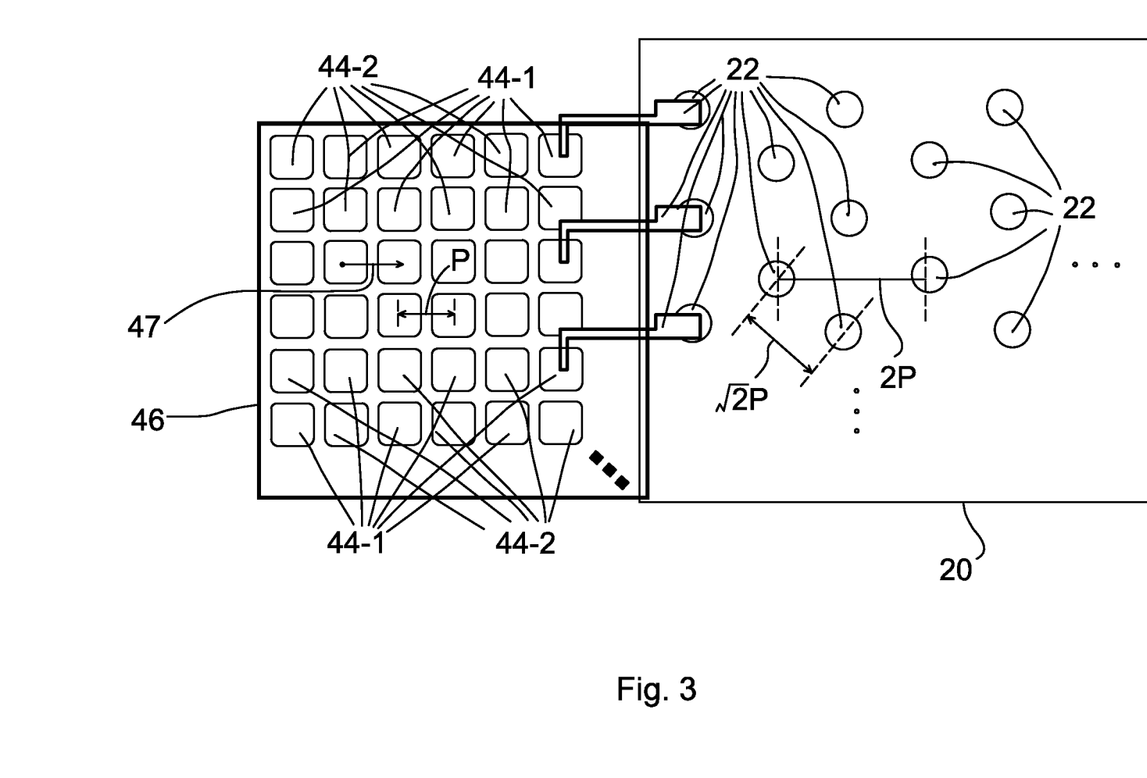
FIGS. 3-7 illustrate test schemes for probing contact pads of interposers in accordance with various embodiments, wherein probe pins may contact a first plurality of contact pads, and then shifted to contact a second plurality of contact pads of the same interposer.

FIG. 2 illustrates a bottom view of an exemplary probe card 20. Probe pins 22 may be arranged as an array with a plurality of rows and columns, or arranged using other periodic patterns. Alternatively, as shown in FIG. 3, probe pins 22 are arranged as two arrays combined together, with each of the probe pins 22 in one of the array being at the center of four probe pins 22 in the other array. The small pitch of probe pins 22 may be achieved, for example, by forming and/or assembling probe card 20 using micro electro mechanical system (MEMS) technology, so that probe pins 22 may have pitches comparable to that of interposers.

FIGS. 3 through 7 schematically illustrate the arrangement of probe pins 22 of probe card 20 and probe pads 44 of interposer 46, and the respective probe schemes. Since it is more difficult to reduce the pitch of probe pins 22 than to reduce the pitch of contact pads 44, probe pins 22 may be designed to have greater pitches than contact pads 44, while the probing may be performed through the shifting of probe card 20, so that all contact pads 44 in a same interposer 46 may be probed. Referring to FIG. 3, interposer 46 and probe card 20 are illustrated, wherein probe pins 22 are in contact with contact pads 44 (including 44-1 and 44-2). In FIG. 3, only three probe pins 30 are shown as having pin-shapes, while the rest of probe pins are represented by circles. Interposer 46 and probe card 20 are illustrated as side by side, although during the probing, probe card 20 is located directly above interposer 46. In an embodiment as shown in FIG. 3, contacts pads 44 include contact pads 44-1 and contact pads 44-2. Probe pins 22 are configured to contact alternating contact pads in each of the rows and columns in the array of contact pads 44. Accordingly, probe pins 22 have the pattern of contact pads 44-1 (or the pattern of contact pads 44-2). The pitches of contact pads 44 and probe pins 22 are also marked as multiplications of "P." As shown in FIG. 3, the pitch of probe pins 22 is greater than the pitch of contact pads 44, and the pitch of probe pins 22 may be equal to the square root of 2 of the pitch of contact pads 44. In a first probe step, probe pins 22 are in contact with contact pads 44-1, and are not in contact with contact pads 44-2. Switch network 24 (FIG. 1) in probe card 20 and the respective driving patterns and expected patterns are also configured correspondingly according to the connections of contact pads 44-1. In a second probe step, probe pins 22 are shifted by a distance, as shown by arrow 47. Accordingly, probe pins 22 are in contact with contact pads 44-2, and not in contact with contact pads 44-1. Switch network 24 in probe card 20 and the respective driving patterns and expected patterns may again be configured correspondingly according to the expected connections of contact pads 44-2. Using this test scheme, the pitch of probe card 20 may be greater than the pitch of contact pads 44, while all contact pads 44 may be probed using the same probe card 20, even through the pitches of probe card 20 is greater than the pitches of interposer 46.

Figure 4:
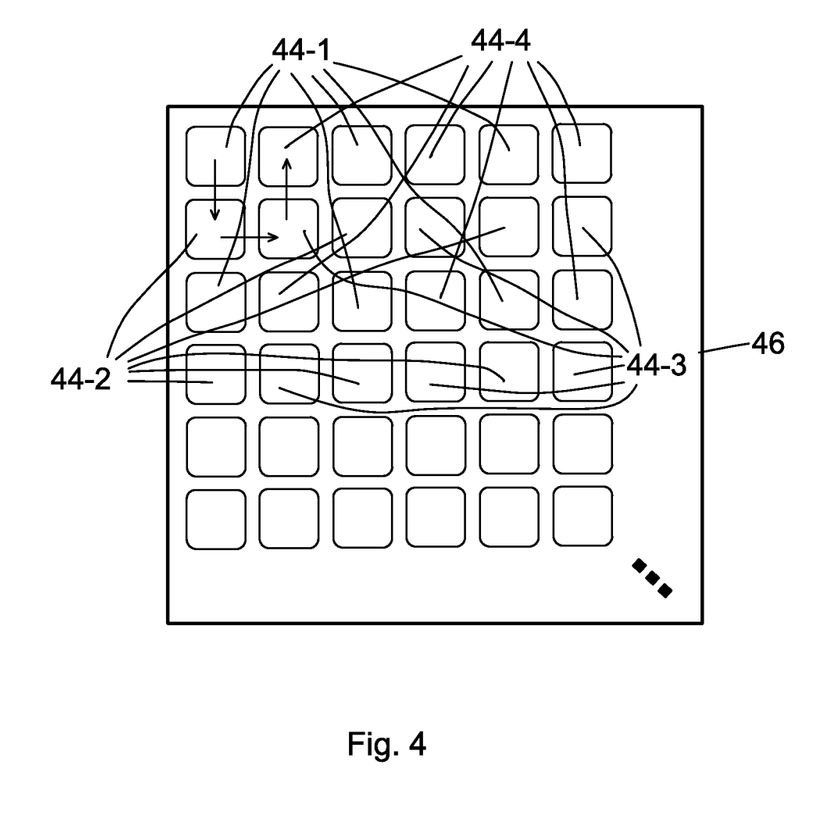

FIG. 4 illustrates interposer 46 in accordance with alternative embodiments. Contact pads 44 may be divided into groups 44-1, 44-2, 44-3, and 44-4. Probe pins 22 (not shown in FIG. 4, please refer to FIG. 2) has a pattern corresponding to, for example, contact pads 44-1. Accordingly, four probe steps may be performed to probe all contact pads 44. In the first probe step, contact pads 44-1 are probed, while probe pins 22 are not in contact with contact pads 44-2, 44-3, and 44-4. Probe card 20 is then shifted (in the direction of arrows, for example) to probe contact pads 44-2. Further shifts are made so that probe card 20 may be used to probe contact pads 44-3 and 44-4. In each of the four probe steps, driving test patterns and switch network 24 may need to be reconfigured accordingly. In this embodiment, the pitch of probe pins 22 may be twice the pitch of contact pads 44.

Figure 5:
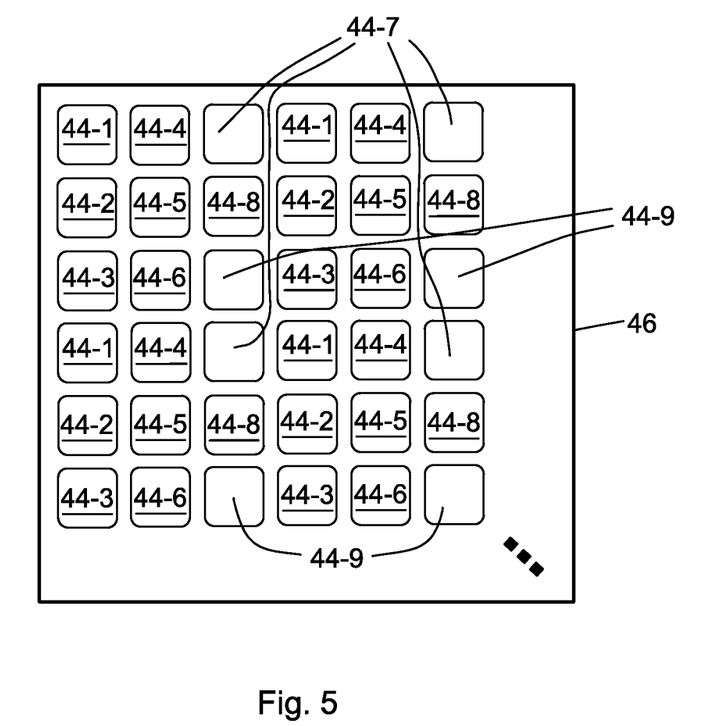

FIG. 5 illustrates interposer 46 in accordance with alternative embodiments, in which contact pads 44 are divided into nine groups, namely 44-1 through 44-9. Probe pins 22 (not shown in FIG. 5, please refer to FIG. 2) has a pattern corresponding to, for example, contact pads 44-1. Accordingly, nine probe steps may be performed to probe all contact pads 44. In each of the probe steps, the contact pads in one of the nine contact pad groups 44-1 through 44-9 are probed, while contact pads 44 in other groups are not probed. In this embodiment, the pitch of probe pins 22 may be three times the pitch of contact pads 44.

Figure 6:
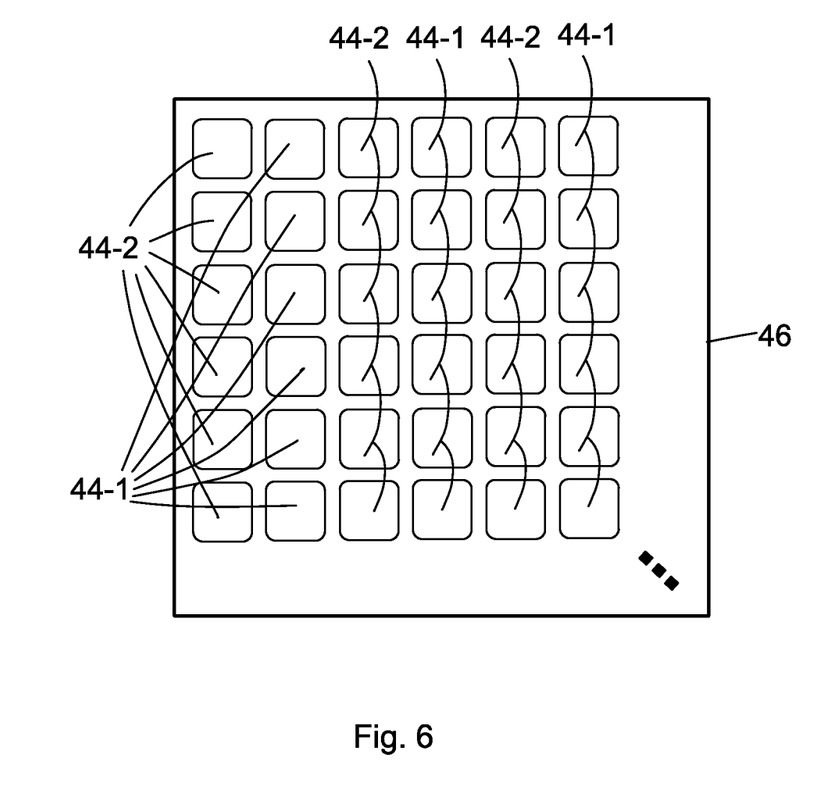
Figure 7:
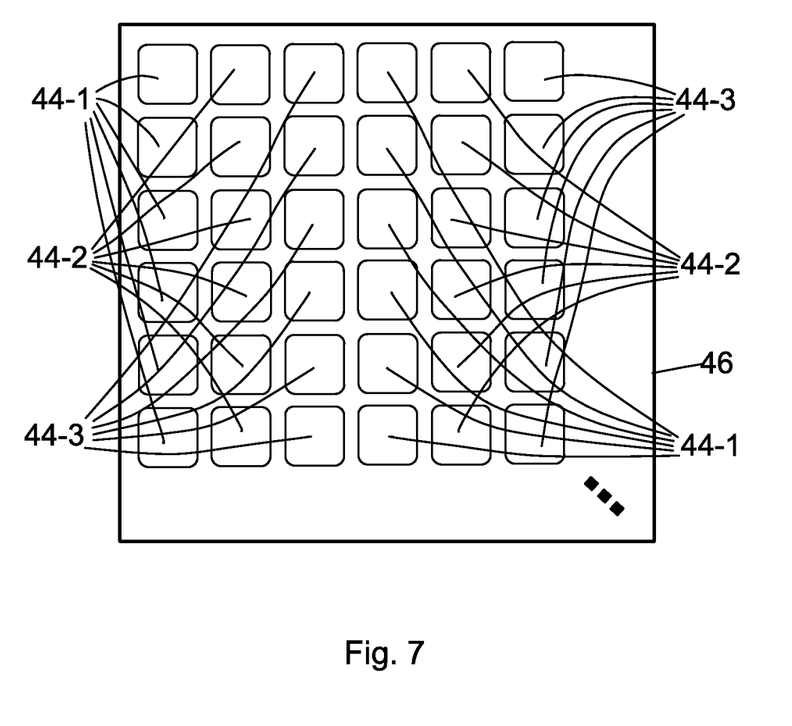

FIGS. 6 and 7 illustrate the probing of contact pads 44 by rows (or columns). In FIG. 6, alternating rows (or columns) of contact pads 44 are divided into different groups marked as 44-1 and 44-2. Contact pads 44 in alternating rows or columns belong to the same group. Similarly. Probe pins 22 are arranged corresponding to contact pads 44-1 or 44-2. Two probe steps are performed to probe all contact pads 44, and in each of the two probe steps, one of two groups 44-1 and 44-2 are probed, while the other group is not probed. The embodiment shown in FIG. 7 is similar to the embodiment shown in FIG. 6, except contact pads 44 are divided into three different groups marked as 44-1, 44-2, and 44-3 according to rows or columns, wherein one of the groups is probed in each of the probe steps. Probe pins 22 are arranged accordingly corresponding to the pattern of contact pads 44-1, for example.

Figure 8A:
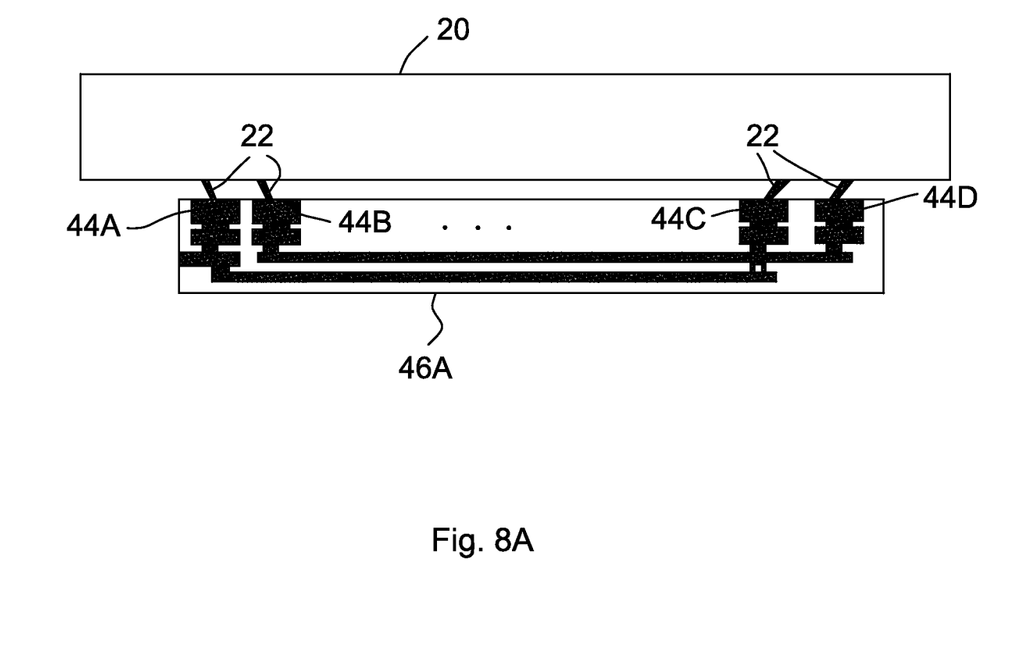
FIGS. 8A and 8B illustrate the probing of interposers having different designs using a same probe card.
Figure 8B:
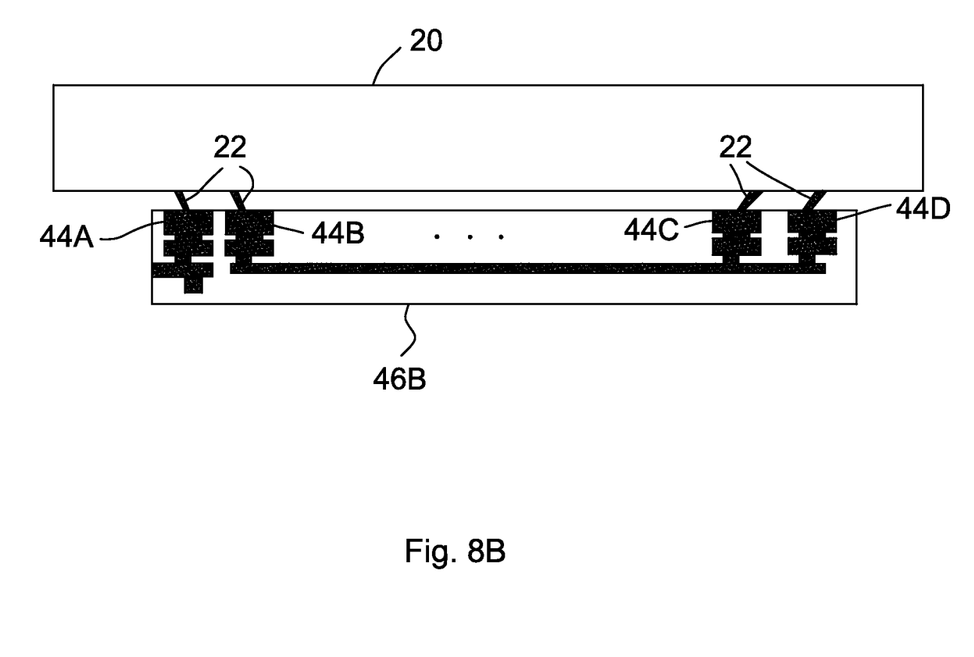

Referring to FIG. 8A, a cross-sectional view of interposer 46A is schematically illustrated, with contact pads 44 contacting probe pins 22. Assuming that in the illustrated embodiment, contact pads 44A and 44B are configured as input pins, while contact pads 44C and 44D are configured as output pins. Since contact pads 44A through 44C are all interconnected, the test patterns are configured so that the expected patterns at output pads 44C and 44D match the driving patterns regardless of whether the driving patterns are inputted into contact pad 44A or contact pad 44B. On the other hand, if the same probe card 20 is used to probe the interposer 46B as shown in FIG. 8B, it is expected that when the driving patterns are provided to contact pad 44A, no output patterns are received from contact pads 44C and 44D. When the driving patterns are provided to contact pad 44B, the expected output patterns from contact pads 44C and 44D are expected to be the same as the driving patterns provided to contact pad 44B, and the output patterns from contact pads 44C and 44D will be compared to the expected patterns to determine whether there is any defective connections.

Figure 9:
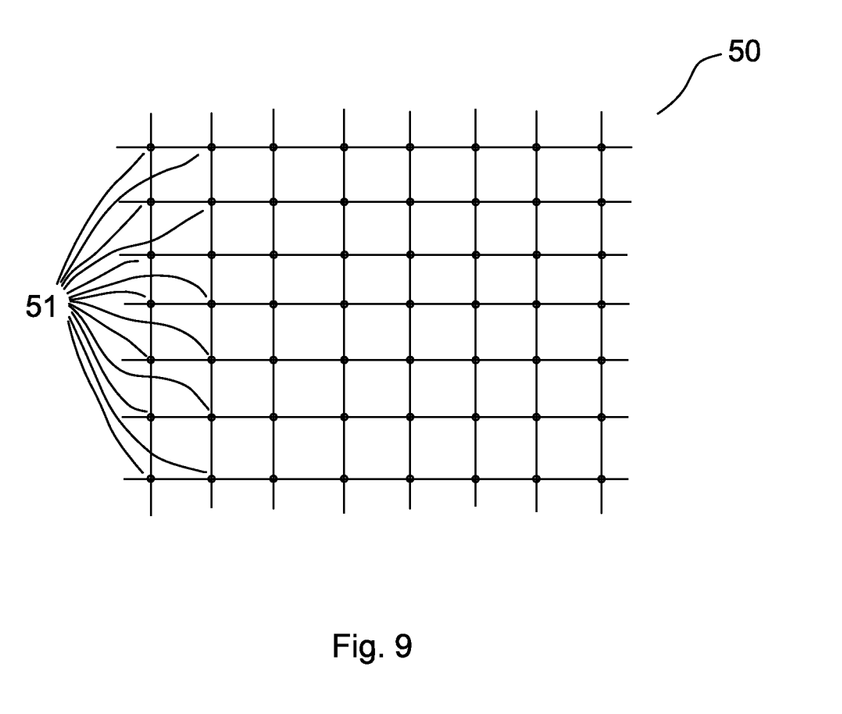
FIG. 9 illustrates a grid, wherein probe pins of a probe card and contact pads are designed to fall on grid nodes of the grid, so that interposers having different designs may be probed using the same probe card.

Comparing the figures shown in FIGS. 8A and 8B, it is appreciated that a same probe card 20 in accordance with embodiments may be used to test a plurality of interposers (or other types of DUTs) having different designs and different connections. To match the pitches and patterns of probe pins 22 with contact pads 44, contact pads 44 and probe pins 22 may be arranged so that they fall on the grid nodes of a same grid. For example, FIG. 9 illustrates grid 50. As long as both the probe pins of a probe card and the contact pads of interposers all fall on the grid nodes of grid 50, the probe card may be used to probe the interposers. By using this scheme, the interposers having different designs may be probed using the same probe card without the need to redesign probe cards.

Figure 10:
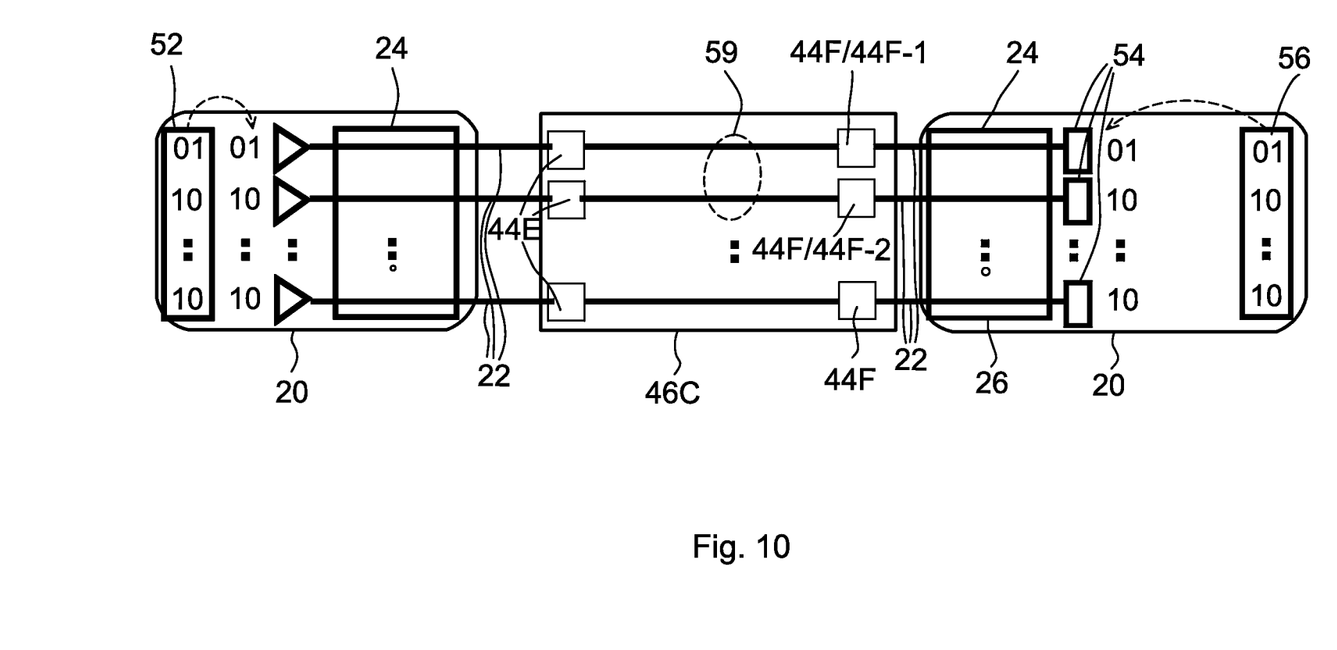
FIG. 10 illustrates the block diagram for probing an interposer by providing driving patterns into input contact pads of the interposer, and comparing output patterns retrieved from output pads of the interposer with expected patterns.
Figure 11:
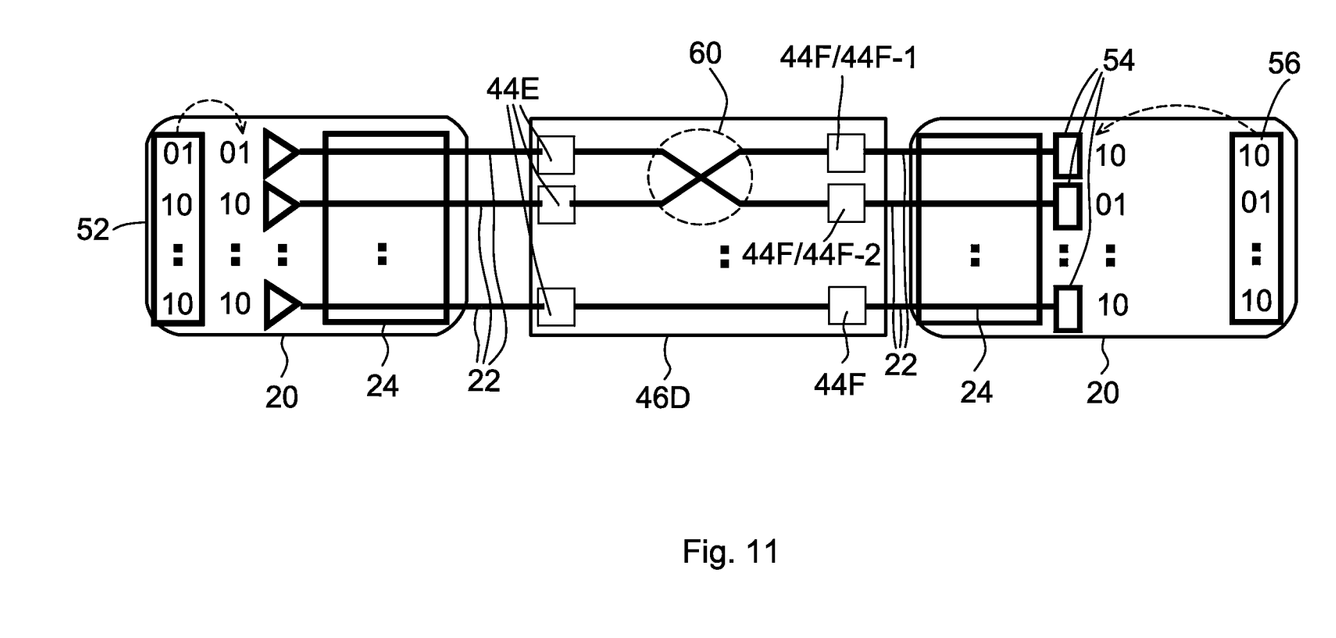
FIG. 11 illustrates the block diagram for probing an interposer having a different design than the interposer shown in FIG. 10, wherein the configuration of the switch network is not changed compared to FIG. 10, while the expected patterns are changed.
Figure 12:
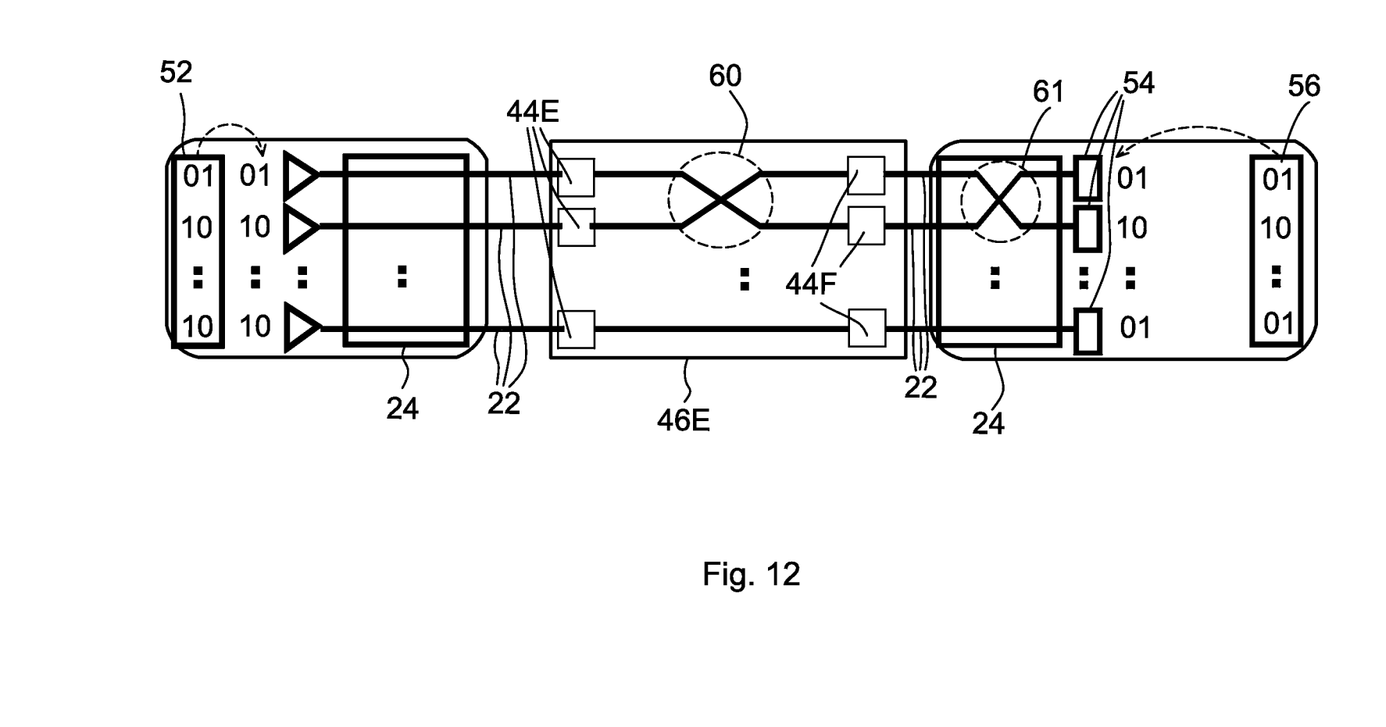
FIG. 12 illustrates the block diagram for probing an interposer having a different design than the interposer shown in FIG. 10, wherein the configuration of the switch network is changed compared to FIG. 10, while the expected patterns are not changed.

FIGS. 10 through 12 illustrate the exemplary schemes for providing driving patterns to interposers 46C/46D/46E, and comparing the resulting output patterns retrieved from interposers 46C/46D/46E with the expected patterns to determine defective connections. Referring to FIG. 10, contact pads 44E and 44F of interposer 46C are configured as input and output pads, respectively, by configuring switch network 24. Driving patterns 52 are provided to corresponding contact pads 44E through switch network 24. Output patterns 54 are generated and received from output pads 44F. Output patterns 54 are compared to expected patterns 56, so that the defective connections may be determined. Driving patterns 52, output patterns 54, and expected patterns 56 may be stored in programmable storage 26 (FIG. 1), wherein the storing and the retrieving of these patterns may be preformed by controller/processor 28 (FIG. 1).

As shown in FIG. 11, interposer 46D and interposer 46C (FIG. 10) have different designs and have different connections. For example, connection 60 in FIG. 11 is different from the respective connection 59 in FIG. 10. If the difference between interposers 46C and 46D is significant, then for probing interposer 46D, probe card 20 and switch network 24 need to be reconfigured, and the driving patterns and the expected patterns may need to be reconfigured either. On the other hand, if the difference between interposer 46C and 46D is not significant, then one of the switch network 24 and driving patterns 56 is reconfigured, while the others may stay the same, and the driving patterns 52 may be kept the same. In an embodiment, as shown in FIG. 11, the same driving patterns 52 that are used for probing interposer 46C may be reused to probe interposer 46D, while the expected patterns 56 for probing interposer 46C and the expected patterns 56 for probing interposer 46D are different. For example, the expected patterns 56 from contact pads 44F1 and 44F2 in FIG. 11 are 10 and 01, respectively, while the expected patterns 56 from contact pads 44F1 and 44F2 in FIG. 10 are 01 and 10, respectively.

FIG. 12 illustrates an embodiment wherein between the probing of interposers 46C and 46E, which are slightly different from each other (as shown by connections 59 and 60), driving patterns 52 do not need to be changed. Expected patterns 56 may not need to be changed either. Instead, switch network 24 is reconfigured to accommodate the change. The changed connection(s) in switch network 24 is marked as 61, which is different from the corresponding connection in FIG. 10. Accordingly, when the connection of interposer 46E is changed from that of interposer 46C, the connections in switch network 24 is also changed.

Figure 13:
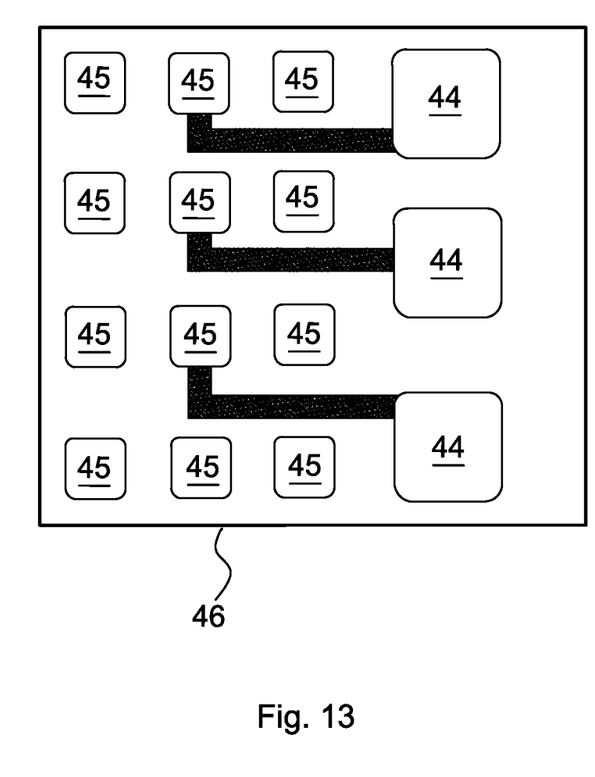
FIG. 13 illustrates the formation of test pads with greater sizes than bond pads of an interposer, wherein the test pads are formed for probing purpose.

In an embodiment, probe pins 22 of the probe cards may be manufactured to have pitches that are small enough to suit to different DUTs, wherein the technologies such as MEMS may be used. In alternative embodiments, as shown in FIG. 13, contact pads 44 are designed to suit to the pitches and the design or probe pins 22, wherein contact pads 44 are designed for probing purpose. Pads 45, on the other hand, are the pads for bonding purpose. Adding contact pads 44 may reduce the risk of damaging bond pads 45, and may solve the problem that the pitch or the size of bond pads 45 is too small to be probed using probe card 20. However, since the addition of contact pads 44 may introduce parasitic, this embodiment may be used for sampling purposes. For example, on the sample wafers for testing, contact pads 44 are formed, while on the wafers of mass production, contact pads 44 are not formed. Alternatively, contact pads 44 may be added to connect to selected bond pads 45 that are not timing critical, and not added for the bond pads 45 that are on the same chip, and are timing critical.

In the embodiments, with the probe cards including reprogrammable switch network, the same probe card may be used to probe different DUTs having different designs. Furthermore, the pitches of the probe cards may be greater than the pitches of contact pads of the DUTs, while all contact pads of the DUTs may still be probed by the same probe card.

In accordance with embodiments, a probe card includes a plurality of probe pins, and a switch network connected to the plurality of probe pins. The switch network is configured to connect the plurality of probe pins in a first pattern, and reconnect the plurality of probe pins in a second pattern different from the first pattern.

In accordance with other embodiments, a probe card includes a plurality of probe pins, and a switch network connected to the plurality of probe pins. The switch network is configured to change connections of the plurality of probe pins. The probe card further includes a programmable storage electrically coupled to the switch network, and a controller/processor electrically coupled to the switch network and the programmable storage.

In accordance with yet other embodiments, a method includes contacting probe pins of a probe card to first contact pads of a first DUT, and configuring a switch network in the probe card to have a first connection to the probe pins. A first probing may then be performed on the first DUT using the probe pins that are configured with the first connection. The probe pins of the probe card may further be used to contact second contact pads of a second DUT, wherein the second DUT has a design different from a design of the first DUT. The switch network is reconfigured to have a second connection different from the first connection. A second probing may then be performed on the second DUT using the probe pins that are configured with the second connection.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
a probe card comprising:
a plurality of probe pins, with neighboring ones of the plurality of probe pins having a first pitch; and
a switch network connected to the plurality of probe pins, wherein the switch network is configured to:
connect the plurality of probe pins in a first pattern; and
reconnect the plurality of probe pins in a second pattern different from the first pattern; and
an interposer comprising a plurality of contact pads in contact with the plurality of probe pins, wherein neighboring ones of the plurality of contact pads have a second pitch smaller than the first pitch, and wherein the probe pins are placed in electrical contact with a first plurality of contact pads, and
wherein, after the probe pins are placed in electrical contact with a first plurality of contact pads the position of the interposer is shifted to put the plurality of probe pins in contact with a second plurality of contact pads of the interposer different from the first plurality of contact pads.

2. The apparatus of claim 1, wherein the probe card comprises active circuits built therein.

3. The apparatus of claim 1, wherein the probe card further comprises inputs/outputs for receiving signals into the probe card, and outputting signals out of the probe card, and wherein the switch network is configured to:
connect one of the inputs/outputs to a first pin in the plurality of probe pins; and
reconnect the one of the inputs/outputs to a second pin in the plurality of probe pins, wherein the first and the second pins of the plurality of probe pins are different pins.

4. The apparatus of claim 1 further comprising a programmable storage configured to store test patterns selected from the group consisting of driving patterns, expected patterns, and combinations thereof.

5. The apparatus of claim 1, wherein the probe card further comprises a controller/processor electrically coupled to, and programmed to control, the switch network.

6. The apparatus of claim 5, wherein the controller/processor is further programmed to:
provide driving patterns to input pins in the plurality of probe pins;
retrieve output patterns from output pins in the plurality of probe pins; and
compare the output patterns with expected patterns.

7. The apparatus of claim 5, wherein the probe card comprises a casing, wherein the switch network and the controller/processor are located in the casing, and wherein the plurality of probe pins extend from inside the casing to outside of the casing.

8. The apparatus of claim 1, wherein the probe card comprises a casing, wherein the plurality of probe pins extends from inside the case to outside of the casing, and wherein the switch network is located in the casing, and wherein a controller/processor is programmed to control the switch network is located outside the casing.

9. The apparatus of claim 1, wherein the plurality of contact pads is arranged as a plurality of rows and a plurality of columns, and the plurality of contact pads comprises:
the first plurality of contact pads in contact with the probe pins, wherein a first plurality of the probe pins is distributed in each of the plurality of rows and each of the plurality of columns; and
the second plurality of contact pads not in contact with the probe pins, wherein a second plurality of the probe pins is distributed in each of the plurality of rows and each of the plurality of columns, and wherein the first plurality of the probe pins and the second plurality of the probe pins are distributed in an alternating layout in the each of the plurality of rows and the each of the plurality of columns.

10. The apparatus of claim 1, wherein the first pitch is equal to a square root of 2 times the second pitch.

11. An apparatus comprising:
a probe card comprising:
a plurality of probe pins;
a switch network connected to the plurality of probe pins, wherein the switch network is configured to change connections of the plurality of probe pins;
a programmable storage electrically coupled to the switch network; and
a controller/processor electrically coupled to the switch network and the programmable storage that is programmed to change connections of the plurality of probe pins; and
an interposer comprising a plurality of contact pads, wherein a first pitch of neighboring ones of the plurality of contact pads is smaller than a second pitch of neighboring ones of the plurality of probe pins, and
and wherein, after the probe pins are placed in electrical contact with a first plurality of contact pads, the position of the interposer is shifted to put the plurality of probe pins in contact with a second plurality of contact pads of the interposer different from the first plurality of contact pads.

12. The apparatus of claim 11, wherein the controller/processor is further configured to:
provide driving patterns stored in the programmable storage to input pins in the plurality of probe pins;
retrieve output patterns from output pins in the plurality of probe pins; and
compare the output patterns with expected patterns stored in the programmable storage.

13. The apparatus of claim 11, wherein the plurality of contact pads comprises:
the first plurality of contact pads in contact with the probe pins, wherein first plurality of the probe pins are distributed in each of the plurality of rows and each of the plurality of columns; and
the second plurality of contact pads not in contact with the probe pins, wherein the second ones of the probe pins are distributed in each of the plurality of rows and each of the plurality of columns, and wherein the first plurality of contact pads and the second plurality of contact pads are distributed in an alternating layout in the each of the plurality of rows and the each of the plurality of columns.

14. The apparatus of claim 11, wherein the second pitch is equal to a square root of 2 times the first pitch.

15. A method comprising:
contacting probe pins of a probe card to a first plurality of contact pads of a first device-under-test (DUT);
configuring a switch network in the probe card to have a first connection to the probe pins;
performing a first probing on the first DUT using the probe pins that are configured with the first connection;
shifting a position of the probe card relative to the first DUT to put the probe pins in contact with a second plurality of contact pads of the first DUT, wherein the first plurality of contact pads and the second plurality of contact pads in combination are arranged as a plurality of rows and a plurality of columns, and wherein the first contact pads and the second contact pads are distributed in an alternating layout in the each of the plurality of rows and the each of the plurality of columns;
reconfiguring the switch network in the probe card to have a second connection different from the first connection; and
performing a second probing on the first DUT using the probe card that is configured with the second connection.

16. The method of claim 15, wherein the step of configuring and reconfiguring are performed electrically.

17. The method of claim 15 further comprising:
contacting the probe pins of the probe card to third contact pads of a second DUT, wherein the second DUT has a design different from a design of the first DUT;
reconfiguring the switch network to have a third connection different from the first connection; and
performing a third probing on the second DUT using the probe pins that are configured with the third connection.

18. The method of claim 17 further comprising:
retrieving first output patterns of the first probing;
comparing the first output patterns with expected patterns of the first probing;
retrieving second output patterns of the third probing; and
comparing the second output patterns with expected patterns of the third probing.

19. The method of claim 15, wherein a first pitch of the probe pins is greater than a second pitch of the first plurality of contact pads and the second plurality of contact pads.

20. The method of claim 19, wherein the first pitch is equal to a square root of 2 times the second pitch.

* * * * *